(12) United States Patent
Okabe et al.

(10) Patent No.: US 11,579,205 B2
(45) Date of Patent: Feb. 14, 2023

(54) ESTIMATION DEVICE, ENERGY STORAGE DEVICE, METHOD FOR ESTIMATION, AND COMPUTER PROGRAM

(71) Applicant: GS Yuasa International Ltd., Kyoto (JP)

(72) Inventors: Yosuke Okabe, Kyoto (JP); Shota Yamauchi, Kyoto (JP); Shuji Hitomi, Kyoto (JP); Shigeki Yamate, Kyoto (JP)

(73) Assignee: GS Yuasa International Ltd., Kyoto (JP)

( * ) Notice: Subject to any disclaimer, the term of this patent is extended or adjusted under 35 U.S.C. 154(b) by 28 days.

(21) Appl. No.: 17/191,162

(22) Filed: Mar. 3, 2021

(65) Prior Publication Data

US 2021/0293892 A1 Sep. 23, 2021

(30) Foreign Application Priority Data

Mar. 18, 2020 (JP) .............................. JP2020-048368

(51) Int. Cl.
*G01R 31/392* (2019.01)
*G01R 31/382* (2019.01)
*G01R 31/374* (2019.01)
*G01R 31/389* (2019.01)

(52) U.S. Cl.
CPC ......... *G01R 31/392* (2019.01); *G01R 31/374* (2019.01); *G01R 31/382* (2019.01); *G01R 31/389* (2019.01)

(58) Field of Classification Search
None
See application file for complete search history.

(56) References Cited

U.S. PATENT DOCUMENTS

| 2006/0273763 | A1* | 12/2006 | Arai ................... G01R 31/3842 320/133 |
| 2011/0077880 | A1* | 3/2011 | Gering ................. G01R 31/392 703/13 |
| 2013/0076363 | A1* | 3/2013 | Takahashi ............. H01M 10/42 324/427 |
| 2013/0110429 | A1 | 5/2013 | Mitsuyama et al. |
| 2015/0260800 | A1 | 9/2015 | Baba et al. |
| 2017/0328957 | A1* | 11/2017 | Suzuki ................. G01R 31/392 |
| 2018/0261893 | A1 | 9/2018 | Fujita et al. |
| 2019/0265306 | A1 | 8/2019 | Matsushita |
| 2020/0150185 | A1* | 5/2020 | Ramezan Pour Safaei ................. H02J 7/0071 |
| 2020/0217901 | A1* | 7/2020 | Sugiyama ......... H01M 10/0525 |
| 2020/0319256 | A1* | 10/2020 | Verma .................. G01R 31/396 |

(Continued)

FOREIGN PATENT DOCUMENTS

| JP | 2008-122165 A | 5/2008 |
| JP | 2011-214843 A | 10/2011 |
| JP | 2011-258337 A | 12/2011 |

(Continued)

*Primary Examiner* — Jas A Sanghera
(74) *Attorney, Agent, or Firm* — Rankin, Hill & Clark LLP

(57) ABSTRACT

Provided is an estimation device including: an acquisition unit that acquires measurement data on an energy storage device; an estimation unit that estimates the amount of deterioration for each deterioration mechanism of the energy storage device based on the acquired measurement data; and an output unit that outputs information based on an estimation result of the estimation unit.

13 Claims, 9 Drawing Sheets

(56) References Cited

U.S. PATENT DOCUMENTS

2021/0033680 A1   2/2021   Ukumori

FOREIGN PATENT DOCUMENTS

| | | |
|---|---|---|
| JP | 2014-74682 A | 4/2014 |
| JP | 2015-59933 A | 3/2015 |
| JP | 2017-126462 A | 7/2017 |
| JP | 2018-147827 A | 9/2018 |
| JP | 2019-148537 A | 9/2019 |
| JP | 2019-168453 A | 10/2019 |
| JP | 2020-42036 A | 3/2020 |

* cited by examiner

FIG. 3

| POSITIVE ELECTRODE | | | | | NEGATIVE ELECTRODE | | | | |
|---|---|---|---|---|---|---|---|---|---|
| ACTIVE MATERIAL | THICKNESS | WIDTH | DEPTH | OCP | ACTIVE MATERIAL | THICKNESS | WIDTH | DEPTH | OCP |
| LMO | Zp | Xp | Yp | ⟋ | GRAPHITE | Zn | Xn | Yn | ⟋ |
| .... | .... | .... | .... | .... | .... | .... | .... | .... | .... |

ESTIMATION DEVICE, ENERGY STORAGE DEVICE, METHOD FOR ESTIMATION, AND COMPUTER PROGRAM

FIELD

The present invention relates to an estimation device, an energy storage device, a method for estimation, and a computer program.

BACKGROUND

In recent years, energy storage devices have been widely used in uninterruptible power systems, DC or AC power supply devices included in regulated power supplies, and the like. The energy storage devices are expanding their uses in large-scale systems for storing renewable energy or electric power generated by existing power generating systems.

Energy storage devices are known that their deterioration progresses by repeating charge and discharge, i.e., capacity decreases. JP 2019-148537 discloses a method for estimating remaining capacity by using an equivalent circuit model of an energy storage device. JP 2019-168453 discloses a method for estimating deterioration of an energy storage device by machine learning using a neural network.

In JP 2019-148537 A and JP 2019-168453 A, the deterioration of the entire device is only approximately estimated using the equivalent circuit model or machine learning without considering a deterioration mechanism of the energy storage device. Thus, the methods disclosed in JP 2019-148537 A and JP 2019-168453 A cannot estimate the amount of deterioration for each deterioration mechanism, and thus, for example, cannot propose a method for reusing an energy storage device based on the amount of deterioration estimated for each deterioration mechanism. The methods also cause difficulty in providing feedback to determine a subsequent action, such as improving product design or an operation method.

SUMMARY

An object of the present invention is to provide an estimation device, an energy storage device, a method for estimation, and a computer program, which are capable of achieving deterioration simulation of the energy storage device in consideration of a deterioration mechanism.

An estimation device according to an aspect of the present invention includes an acquisition unit that acquires measurement data on an energy storage device, an estimation unit that estimates the amount of deterioration for each deterioration mechanism of the energy storage device based on the acquired measurement data, and an output unit that outputs information based on an estimation result of the estimation unit.

BRIEF DESCRIPTION OF DRAWINGS

FIG. 3 is a conceptual diagram showing an example of a battery table.

DESCRIPTION OF EMBODIMENTS (Overview)

Figure 1:
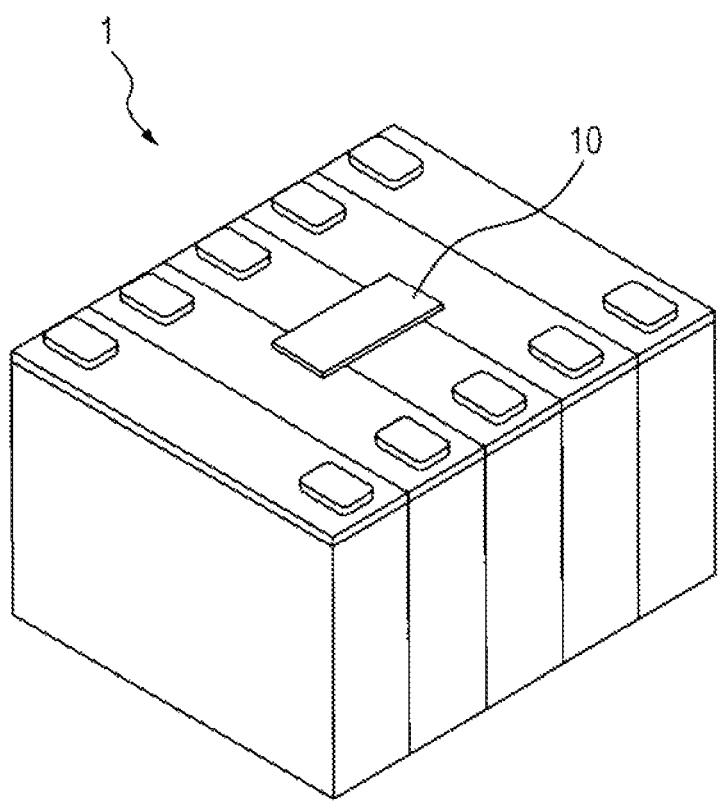
FIG. 1 is a schematic view illustrating a structural example of an energy storage device equipped with an estimation device according to a first embodiment.

An estimation device according to an aspect of the present invention includes an acquisition unit that acquires measurement data on an energy storage device, an estimation unit that estimates the amount of deterioration for each deterioration mechanism of the energy storage device based on the acquired measurement data, and an output unit that outputs information based on an estimation result of the estimation unit.

The energy storage device may include a circuit board equipped with the estimation device described above.

A method for estimation implemented by a computer, according to another aspect of the present invention, includes the steps of: acquiring measurement data on an energy storage device; estimating the amount of deterioration for each deterioration mechanism of the energy storage device based on the acquired measurement data; and outputting information based on an estimation result.

A computer program according to still another aspect of the present invention allows a computer to execute the processes of: acquiring measurement data on an energy storage device; estimating the amount of deterioration for each deterioration mechanism of the energy storage device based on the acquired measurement data; and outputting information based on an estimation result.

The aspects described above enable achieving a deterioration simulation of an energy storage device in consideration of a deterioration mechanism.

DETAILED DESCRIPTION

An estimation device includes an acquisition unit that acquires measurement data on an energy storage device, an estimation unit that estimates the amount of deterioration for each deterioration mechanism of the energy storage device based on the acquired measurement data, and an output unit that outputs information based on an estimation result of the estimation unit.

Thus, the estimation device can estimate the amount of deterioration in real time, e.g., during operation of the energy storage device, by a simulation in consideration of a physical mechanism of deterioration. The estimation device performs a simulation based on a physical principle, and thus facilitates consideration of a simulation result. For example, a reuse method, operating conditions, replacement time based on a remaining value, and the like of the energy storage device can be proposed to a user based on the amount of deterioration estimated for each deterioration mechanism. The term, "reuse", used herein refers to use of a battery cell (cell) for another application without disassembling the battery cell.

Measurement data acquired by the acquisition unit may include data on a current and temperature of the energy storage device. This configuration enables executing a deterioration simulation in real time, for example, based on actual measured values of the current and temperature of the energy storage device.

The deterioration mechanism may include isolation of active material particles, and decrease in number of charge carriers involved in charge and discharge. The term, "charge carriers", used herein refers to charge carriers existing in a solid phase or a liquid phase, and means lithium ions ($Li^+$) in the case of a lithium ion battery, for example. This configuration enables individual estimation of the amount of deterioration due to the isolation of active material particles and the amount of deterioration due to the decrease in number of charge carriers. When deterioration of the energy storage device is mainly caused by the isolation of active material particles, use at a low rate can be proposed as a reuse method, for example. When the deterioration of the energy storage device is mainly caused by the decrease in number of charge carriers, an auxiliary power supply such as an uninterruptible power supply (UPS) can be proposed for reuse application, for example.

The deterioration mechanism may further include at least one of increase in electric resistance in each element constituting the energy storage device and decrease in conductivity in an electrolyte solution. This configuration enables individual estimation of the amount of deterioration due to the isolation of active material particles, the amount of deterioration due to the decrease in number of charge carriers, the increase in electric resistance, and the decrease in conductivity in the electrolyte solution. When the deterioration of the energy storage device is mainly caused by the increase in electric resistance, storage application of natural energy such as sunlight can be proposed as reuse application, for example.

The output unit may be configured to identify a deterioration factor of the energy storage device based on an estimation result of the estimation unit, and output information on a recommended reuse method of the energy storage device, being suitable for the identified deterioration factor. This configuration enables proposing a reuse method of the energy storage device, being suitable for an identified deterioration factor to a user.

The output unit may be configured to determine recommended operating conditions of the energy storage device based on the amount of deterioration estimated based on the measurement data and the amount of deterioration estimated by virtually changing operating conditions of the energy storage device, and output information on the determined operating conditions. This configuration enables proposing operating conditions that can suppress progress of deterioration to a user.

The output unit may be configured to calculate and output a remaining value of the energy storage device based on an estimation result of the estimation unit. The output unit may be configured to output information on replacement time based on the calculated remaining value. This configuration enables encouraging a user in replacement before a remaining value decreases sharply.

A method for estimation using a computer includes the steps of: acquiring measurement data on an energy storage device; estimating the amount of deterioration for each deterioration mechanism of the energy storage device based on the acquired measurement data; and outputting information based on an estimation result. This configuration enables estimating the amount of deterioration in real time, e.g., during operation of the energy storage device, by a simulation in consideration of a physical mechanism of deterioration.

A computer program allows a computer to execute the processes of: acquiring measurement data on an energy storage device; estimating the amount of deterioration for each deterioration mechanism of the energy storage device based on the acquired measurement data; and outputting information based on an estimation result.

Hereinafter, the present invention will be specifically described with reference to the drawings showing the embodiments thereof.

First Embodiment

FIG. 1 is a schematic view illustrating a structural example of an energy storage device 1 equipped with an estimation device 10 according to a first embodiment. The energy storage device 1 is, for example, a lithium ion battery having a liquid electrolyte. Alternatively, the energy storage device 1 may be any battery such as a laminate type (pouch type) lithium ion battery, a lithium ion battery having an electrolyte of an ion liquid, a lithium ion battery having a gel electrolyte, an all-solid lithium ion battery, a bipolar type lithium ion battery (a battery in which electrodes are electrically connected in series), a zinc air battery, a sodium ion battery, or a lead-acid battery. The energy storage device 1 may be a single cell, a module in which a plurality of cells is connected in series and/or in parallel, a bank in which a plurality of modules is connected in series, a domain in which a plurality of banks is connected in parallel, or the like.

The estimation device 10 may be mounted on the energy storage device 1 to be estimated. For example, the estimation device 10 and the energy storage device 1 may be housed in an identical housing (housing, battery panel, etc.). The estimation device 10 acquires measurement data on the energy storage device 1 and estimates a deterioration state of the energy storage device 1 by using a deterioration simulator based on a deterioration mechanism of the energy storage device 1. The measurement data acquired by the estimation device 10 includes data on a current of the energy storage device 1 and data on temperature of the energy storage device 1. Deterioration of the energy storage device 1 represents, for example, an event in which charge-discharge capacity decreases when the energy storage device 1 is used repeatedly, and thus the energy storage device 1 does not last long. The deterioration is divided into aging deterioration that occurs only with elapse of time and cycle deterioration that occurs with use (charge-discharge) of the energy storage device 1. Instead of the number of cycles, total energized electric quantity may be used.

The example of FIG. 1 shows the estimation device 10 as a flat circuit board installed on an upper surface of the energy storage device 1. Alternatively, the estimation device 10 may be installed on a side surface or the like of the energy storage device 1, or may be installed away from the energy storage device 1. The shape of the estimation device 10 is not limited to the shape of a flat plate. The estimation device 10 may be provided in a battery management unit (BMU) or a server device installed in a remote location. In the latter case, measurement data measured for the energy storage device 1 may be transmitted to a server device by communication.

Figure 2:
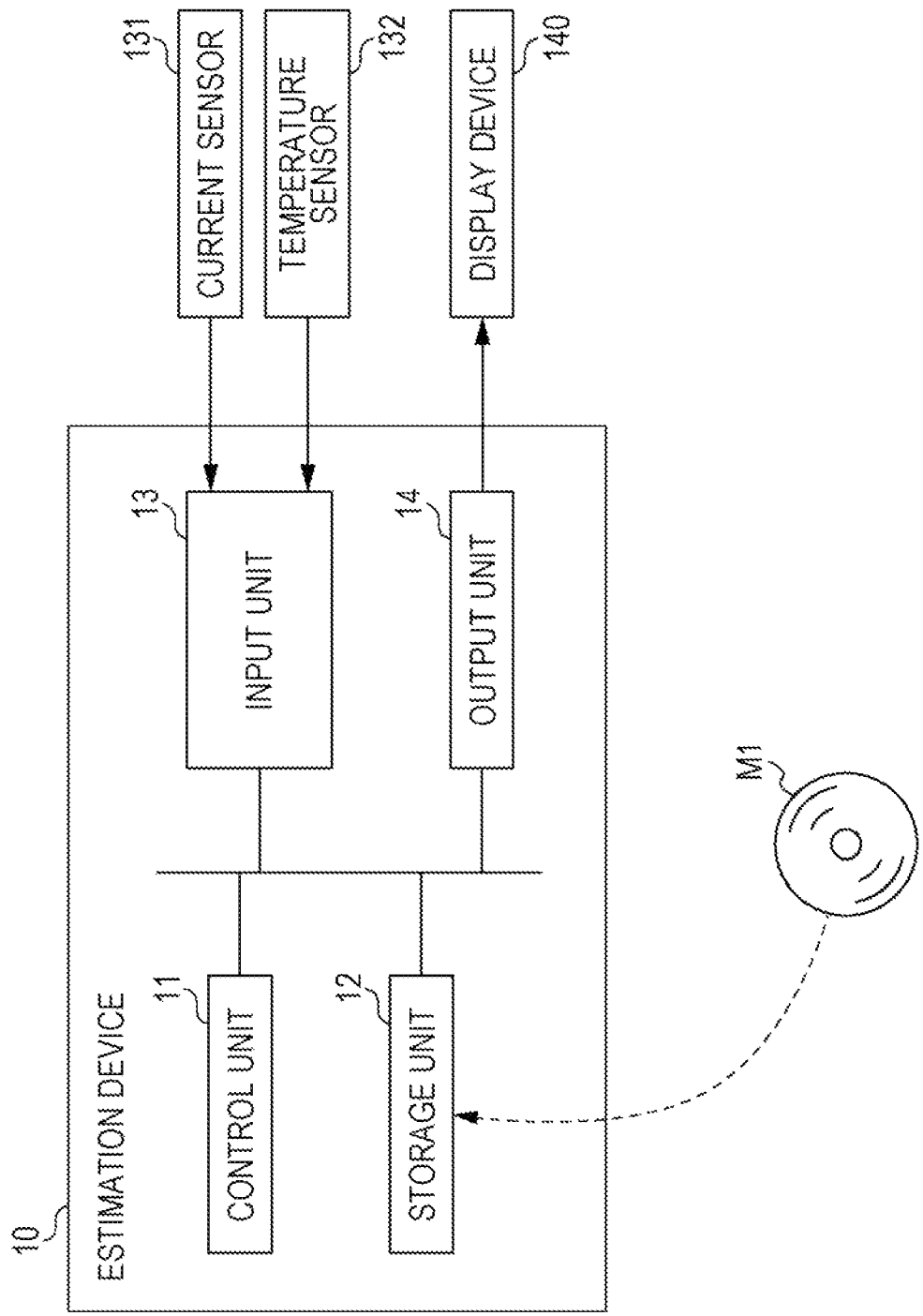
FIG. 2 is a block diagram illustrating an internal configuration of an estimation device.

FIG. 2 is a block diagram illustrating the internal configuration of the estimation device 10. The estimation device 10 includes, for example, a control unit 11, a storage unit 12, an input unit 13, and an output unit 14.

The control unit 11 is composed of, for example, a central processing unit (CPU), a read only memory (ROM), a random access memory (RAM), and the like. The CPU included in the control unit 11 expands and executes various computer programs stored in the ROM or the storage unit 12 on the RAM, thereby causing the entire device to function as the estimation device of the present application.

Alternatively, the control unit 11 may be any processing circuit or arithmetic circuit including a plurality of CPUs, a multi-core CPU, a graphics processing unit (GPU), a microcomputer, a volatile or non-volatile memory, and the like. The control unit 11 may have functions of a timer for measuring elapsed time from when measurement start is instructed to when measurement end is instructed, a counter for counting, a clock for outputting date and time information, and the like.

The storage unit 12 is a storage device such as a flash memory. The storage unit 12 stores various computer programs executed by the control unit 11, data necessary for executing the computer programs, and the like. One of the computer programs stored in the storage unit 12 is an estimation processing program for estimating a deterioration state of the energy storage device 1 by using a deterioration simulator based on the deterioration mechanism of the energy storage device 1. The deterioration simulator used by the estimation processing program is composed of, for example, execution binary. A theoretical formula that is a basis of the deterioration simulator is described by an algebraic equation or a differential equation that represents the deterioration mechanism of the energy storage device 1. The deterioration simulator may be prepared for each deterioration mechanism, or may be prepared as one computer program.

The deterioration simulator may be described by commercially available numerical analysis software or programming language such as MATLAB (registered trademark), Amesim (registered trademark), Twin Builder (registered trademark), MATLAB & Simulink (registered trademark), Simplorer (registered trademark), ANSYS (registered trademark), Abaqus (registered trademark), Modelica (registered trademark), VHDL-AMS (registered trademark), C language, C++, or Java (registered trademark). The numerical analysis software may be a circuit simulator called 1D-CAE, or a simulator such as a finite element method or a finite volume method performed in a 3D shape. Alternatively, a reduced-order model (ROM) based on these may be used.

The computer program including the estimation processing program and the deterioration simulator may be provided by a non-transitory recording medium M1 in which the computer program is recorded in a readable manner. The recording medium M1 is, for example, a portable memory such as a CD-ROM, a universal serial bus (USB) memory, a secure digital (SD) card, a micro SD card, and a compact flash (registered trademark). In this case, the control unit 11 reads out the computer program from the recording medium M1 using a reading device (not illustrated), and installs the computer program read out in the storage unit 12. When the estimation device 10 includes a communication unit, the computer program including the estimation processing program and the deterioration simulator may be provided through communication. In this case, the control unit 11 acquires the computer program including the estimation processing program and the deterioration simulator through communication, and installs the computer program acquired in the storage unit 12.

The storage unit 12 may have a battery table that stores information on the energy storage device 1. FIG. 3 is a conceptual diagram showing an example of the battery table. The battery table registers battery information including, for example, information on a positive electrode and a negative electrode, information on an electrolyte solution, information on a tab, and the like. The information on a positive electrode and a negative electrode includes an active material name, a thickness, a width, a depth, an open circuit potential, and the like of the positive electrode and the negative electrode. The information on an electrolyte solution and a tab includes an ion species, a transport number, a diffusion coefficient, a conductivity, and the like. The battery table may include links that refer to information such as the physical properties, an operating state, and a circuit configuration of the energy storage device 1. The information stored in the battery table may be preliminarily set suitable for the energy storage device 1 equipped with the estimation device 10. The information stored in the battery table is used as a part of simulation conditions when deterioration of the energy storage device 1 is simulated.

The input unit 13 includes an interface for connecting various sensors. The sensors connected to the input unit 13 include a current sensor 131 and a temperature sensor 132. The current sensor 131 is an existing sensor such as a current transformer and a Hall effect type current sensor, and measures a discharge current of the energy storage device 1 in time series. The estimation device 10 acquires current data measured by the current sensor 131 at any time through the input unit 13. The temperature sensor 132 is an existing sensor such as a thermocouple or a thermistor, and measures temperature of the energy storage device 1 in time series. The estimation device 10 acquires temperature data measured by the temperature sensor 132 at any time through the input unit 13.

The output unit 14 includes a connection interface for connecting a display device 140. An example of the display device 140 is a liquid crystal display device. When an estimation result using the deterioration simulator described above is obtained, the control unit 11 of the estimation device 10 outputs information based on the estimation result from the output unit 14 to the display device 140. The display device 140 displays the estimation result based on the information output from the output unit 14.

Alternatively, the output unit 14 may include a communication interface for communicating with an external device. The external device communicatively connected to the output unit 14 is a terminal device such as a personal computer or a smartphone used by a user, an administrator, or the like. When an estimation result using the deterioration simulator is obtained, the control unit 11 of the estimation device 10 transmits information based on the estimation result from the output unit 14 to the terminal device. The terminal device receives the information transmitted from the output unit 14, and displays the estimation result on a display of the terminal device itself based on the received information.

The estimation device 10 uses a deterioration simulator based on first to fourth deterioration mechanisms described below to estimate the amount of deterioration of the energy storage device 1 for each of the deterioration mechanisms. The deterioration mechanisms are each represented by a physical model of the energy storage device 1. The physical model represents a phenomenon inside the energy storage device 1 using an algebraic equation, a differential equation, or the like in accordance with an established natural phenomenon (a physical law or a chemical law). The estimation device 10 uses a simulator (white box) based on the deterioration mechanisms to estimate deterioration, and thus has an advantage to be able to grasp the amount of deterioration for each of the deterioration mechanisms as compared with a conventional method in which an equivalent circuit model or machine learning (black box) is used for estimating deterioration without grasping a natural phenomenon.

As the first deterioration mechanism, deterioration due to isolation of active material particles will be described. The deterioration mechanism due to the isolation of active material particles is a phenomenon as follows: the active material particles crack due to repeated expansion and contraction caused by charge and discharge; a region where charge carriers cannot be removed and inserted gradually increasing; and a place in which the charge carriers of the active material particles can be occluded decreases to reduce the amount of electric charge that can be stored (i.e., battery capacity). Occlusion is a phenomenon in which charge carriers are retained in a solid phase, i.e., in the active material particles.

The control unit 11 of the estimation device 10 calculates a rate at which the isolation of the active material particles progresses according to Expression 1 or 2.

$$r_{cycle,iso} = -k_{0,iso}(N)\exp\left(-\frac{E_{a0,iso}}{RT}\right)|i|^{\alpha_{iso}} \quad \text{[Expression 1]}$$

Here, $r_{cycle,iso}$ represents a rate (1/number of cycles) at which the isolation of the active material particles progresses in accordance with the number of cycles. In the present specification, the number of cycles represents the number of times of charge and discharge. Typically, $r_{cycle,\ iso}$ is less than zero. A reaction rate constant is designated as $k_{0,iso}$ that is a function of the number of cycles, for example. Activation energy (J/mol) of cycle deterioration is designated as $E_{a0,\ iso}$ that is a coefficient representing an effect of temperature. A current density (A/m$^2$) is designated as i. A magnitude of the current density i is a coefficient related to an expansion-contraction rate of an electrode and representing a rupture phenomenon dependent on a strain rate, such as creep or crack growth. A constant is designated as $\alpha_{iso}$. Values of $k_{0,\ iso}$, $E_{a0,\ iso}$, and $\alpha_{iso}$ may be set by a user or may be preset in the estimation device 10.

$$r_{t,iso} = -k_{1,iso}(t)\exp\left(-\frac{E_{a1,iso}}{RT}\right)\Delta t \quad \text{[Expression 2]}$$

Here, $r_{t,\ iso}$ represents a rate (1/s) at which the isolation of the active material particles progresses with elapsed time. Typically, $r_{t,\ iso}$ is less than zero. A reaction rate constant is designated as $k_{1,iso}$ that is a function of time, for example. Alternatively, $k_{1,\ iso}$ may be defined by any function based on experimental data. Activation energy (J/mol) of time deterioration is designated as $E_{a1,\ iso}$ that is a coefficient representing an effect of temperature. Elapsed time (s) is designated as $\Delta t$. When stress inside a battery is low, isolation is less likely to progress only with time. However, when the battery is in a high stress state due to strong external restraint, the isolation may be affected. Values of $k_{1,\ iso}$ and $E_{a1,\ iso}$ may be set by a user or may be preset in the estimation device 10.

When a solid-phase volume ratio of the active material particles at an N cycle is designated as $\varepsilon_s$ (N), $\varepsilon_s$ (N+1) is represented by Expression 3 obtained by adding a cycle deterioration rate and a time deterioration rate per one cycle to $\varepsilon_s$ (N).

$$\varepsilon_s(N+1) = \varepsilon_s(N) + r_{cyclo,iso} + r_{t,iso} \quad \text{[Expression 3]}$$

Here, there will be described the reason why the energy storage device 1 deteriorates as the solid phase volume ratio $\varepsilon_s$ of the active material particles decreases, i.e., as the number of places where charge carriers can be occluded in the energy storage device 1 decreases, the amount of electricity that can be stored, i.e., electric capacity, decreases.

The decrease in electric capacity will be described using a minimum concentration $c_{smin}$ and a maximum concentration $c_{smax}$ of the occluded charge carriers. In the case of a positive electrode, the maximum concentration is acquired at an end of discharge, and the minimum concentration is acquired at full charge. Volume required to calculate these concentrations of charge carriers is volume of a phase in which the charge carriers occluded can exist. When apparent volume of an electrode (e.g., a coating area is multiplied by a coating thickness) is designated as $V_{app}$ (m$^3$) and a solid-phase volume ratio of the active material particles in the electrode at the time of manufacture is designated as $\varepsilon_{s0}$, the volume of a phase in which the charge carriers occluded can exist is $V_{app}\varepsilon_{s0}$. When battery capacity at the time of manufacture is designated as $Q_0$ (C or Ah), Expression 4 holds. A valence is designated as z and the Faraday constant (C/mol) is designated as F.

$$Q_0 = zFV_{app}\varepsilon_{s0}(c_{smax}-c_{smin}) \quad \text{[Expression 4]}$$

As the battery deteriorates and isolation of the electrodes progresses, the solid-phase volume ratio $\varepsilon_s$ of the active material particles contributing to electricity storage decreases to less than $\varepsilon_{s0}$. When the battery capacity with the active material particles at the solid phase volume ratio having reached $\varepsilon_s$ is designated as Q, Expression 5 holds.

$$Q = zFV_{app}\varepsilon_s(c_{smax}-c_{smin}) \quad \text{[Expression 5]}$$

Expression 6 is acquired by eliminating unnecessary characters from Expressions 4 and 5.

$$\frac{Q}{\varepsilon_s} = \frac{Q_0}{\varepsilon_{s0}} \quad \text{[Expression 6]}$$

This shows that as $\varepsilon_s$ decreases to less than $\varepsilon_{s0}$, Q decreases to less than $Q_0$. This is the reason why the battery capacity decreases due to the isolation. The capacity (the amount of deterioration) reduced by the isolation is represented by Expression 7 below.

$$\Delta Q_{iso} = Q_0 - Q = \left(1 - \frac{\varepsilon_s}{\varepsilon_{s0}}\right)Q_0 \quad \text{[Expression 7]}$$

Here, $Q_0$ indicates capacity of a battery at the time of manufacture, and Q indicates discharge capacity when the battery is discharged to lower limit voltage by simulation.

Although the first embodiment 1 is described for a configuration in which a rate at which isolation of the active material particles progresses is calculated by Expressions 1 and 2, the arithmetic expressions merely examples, and thus the configuration may be freely modified based on experimental results and literature data.

The first embodiment is described for a configuration in which the rate at which the isolation of the active material particles progresses is calculated as a function of the number of cycles or elapsed time. Alternatively or additionally, the control unit 11 may calculate the rate at which the isolation of the active material particles progresses using Expression 8 with factors of functions of upper and lower limits of SOC when an energization direction is switched. The SOC is an abbreviation for state of charge, and represents a fully charged state as 100% and a fully discharged state as 0%. An upper limit value $SOC_{max}$ and a lower limit value $SOC_{min}$ may be set by a user or may be preset in the estimation device 10. There are many known cases in which as a value of ($SOC_{max}$–$SOC_{min}$) increases, a rate of progress of isolation increases. Thus, a function that increases a reaction rate as the value of ($SOC_{max}$–$SOC_{min}$) increases is preferably used. Instead of the number of cycles, total energized electric quantity may be used.

$$r_{cycle,iso} = -k_{0,iso}(N)\exp\left(-\frac{E_{a0,iso}}{RT}\right)|i|^{\alpha_{iso}} f(SOC_{max}, SOC_{min}) \quad [\text{Expression 8}]$$

Although the parameters $k_{0,\ iso}$, $E_{a0,\ iso}$, $\alpha_{iso}$, $k_{1,\ iso}$, $E_{a1,\ iso}$, $SOC_{max}$, iso, and $SOC_{min}$, iso are used in the rate expressions to determine progress of isolation, these parameters each desirably use values different between positive and negative electrodes. The above values may be different between a charge process and a discharge process. The estimation device 10 may simulate a cause of isolation in the entire battery by separately simulating contribution of the positive electrode and contribution of the negative electrode. When the isolation is not required to be considered, an appropriate parameter may be invalidated, such as by setting $k_{0,\ iso}$ to 0.0.

As the second deterioration mechanism, deterioration due to decrease in number of charge carriers (capacity imbalance) involved in charge and discharge will be described. The deterioration mechanism due to the decrease in number of charge carriers is a phenomenon in which ions in an electrolyte solution disappear due to a side reaction on a surface of an electrode during charge.

For example, a lithium ion battery causes not only a main reaction ($Li^+ + e^- + 6C \rightarrow LiC_6$) but also a side reaction in which $LiC_6$ reacts with organic substances to adheres to surfaces of electrode active material particles as a resistor coating, when lithium ions in an electrolyte solution enter graphite (i.e., during charge). The main reaction is a reversible reaction in which applying voltage in reverse causes reaction, "$Li \rightarrow Li^+ + e^-$", but the side reaction is irreversible. That is, the lithium ions once formed as the resistor coating cannot subsequently participate in charge and discharge, and thus capacity decreases. This mechanism is called decrease in number of charge carriers (or capacity imbalance) involved in charge and discharge. The second deterioration mechanism is caused by decrease in lithium ion concentration of the electrolyte solution, and does not mean that an electrode material deteriorates. That is, the second deterioration mechanism has room for reuse after dismantling and cleaning.

The second deterioration mechanism is known to be accelerated by both time and cycles in a lithium ion battery. During charge, as represented by a reaction, "$Li^+ + 6C + P \rightarrow xLiC_6 + (1-x)Li_{SEI}$", Li is generated in the main reaction (ideally x=1), and a by-product called $Li_{SEI}$ is also generated. A substance of a source of the by-product is designated as P. Here, although "x: (1–x)" shows a stoichiometric ratio of the main reaction to the side reaction, the side reaction usually has a very small stoichiometric coefficient of "(1–x)/x<<1". Lithium ions, which are acquired by multiplying the stoichiometric coefficient of the side reaction by current density and a surface area of the electrode and dividing the multiplied value by the Faraday constant, disappear from the electrolyte solution. To represent the second deterioration mechanism, an inflow $J_{Li}$ (mol/m$^2$ s) of Li into the solid phase may be set equal to $xJ_{Li+}$, where the amount of $Li^+$ having disappeared in the liquid phase is designated as $J_{Li+}$ (mol/m$^2$ s).

A function of the upper limit value $SOC_{max}$, the lower limit value $SOC_{min}$, the temperature T, and the current density i may be appropriately designated as x. For example, the function may be defined as described in Expression 9. A function defined to fit experimental data is designated as h.

Here, x is set as follows: 0.0≤x≤1.0.

$$x = h(SOC_{max}, SOC_{min}, T, |i|) \quad [\text{Expression 9}]$$

The side reaction occurs even when no power is supplied except during charge. In this case, a disappearance rate $r_{Li}$ of lithium ions may be applied as a function of time ($r_{Li}=g$ (t)) based on actual measurement data. As a function g, a function proportional to the square root of time t is often used. The function g may further include a factor related to temperature.

The estimation device 10 calculates decrease in capacity due to decrease in number of charge carriers after eliminating effect of isolation of active material particles and effect of ohm overvoltage and activation overvoltage. For example, to eliminate the effect of isolation of the active material particles, the estimation device 10 changes the solid-phase volume ratio $\varepsilon_s$ of the active material particles at the positive electrode and the negative electrode at calculation time to the solid-phase volume ratio $\varepsilon_{s0}$ at the time of manufacture. Similarly, to eliminate the effect of ohm overvoltage and activation overvoltage, the estimation device 10 sets a value of a flowing current to a very small value. For example, the flowing current may be set to 0.01C (1C is a current when a total amount of electricity of the energy storage device 1 is discharged in one hour). Alternatively, to reduce internal resistance of the battery, alternating current density, electron conductivity, and ionic conductivity may each be set to an extremely large value.

After changing the solid-phase volume ratio of the active material particles and the value of the flowing current, the estimation device 10 calculates volume (the amount of deterioration) $\Delta Q_{imb}$ having decreased due to decrease in number of charge carriers (capacity imbalance) according to Expression 8.

$$\Delta Q_{imb} = Q_0 - Q \quad [\text{Expression 10}]$$

Here, $Q_0$ indicates capacity of a battery at the time of manufacture, and Q indicates discharge capacity when the battery is discharged to lower limit voltage by simulation.

As the third deterioration mechanism, increase in electric resistance in each element constituting the energy storage device 1 will be described. Factors of increase in electric resistance include peeling between current collector foil and an electrode, breakage of a conduction path of conductive auxiliary agents, and formation of a resistor coating at each of a positive electrode and a negative electrode of the energy storage device 1.

Figure 4:
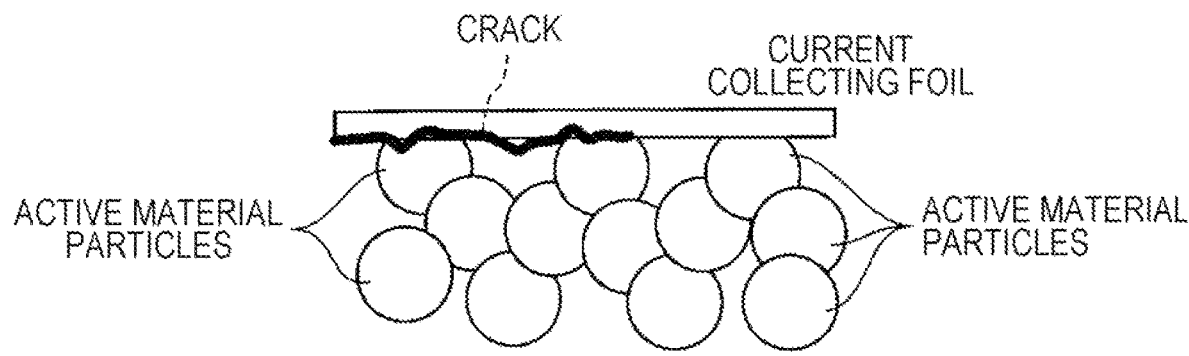
FIG. 4 is an explanatory diagram illustrating peeling between current collector foil and an electrode.

FIG. 4 is an explanatory diagram illustrating peeling between current collector foil and an electrode. The energy storage device 1 immediately after a start of use is in a state where the current collector foil and the electrode (positive electrode or negative electrode) are in close contact with each other, and electric resistance between the current collector foil and the electrode is relatively small. However, bonding between the current collector foil and the electrode is not well, so that a crack is formed between particles (active material particles constituting the electrode) due to expansion and contraction of the particles caused by charge and discharge. Thus, the current collector foil and the electrode are reduced in adhesion therebetween, and then are peeled off. As a result, a path through which a current flows decreases and electric resistance increases.

Figure 5:
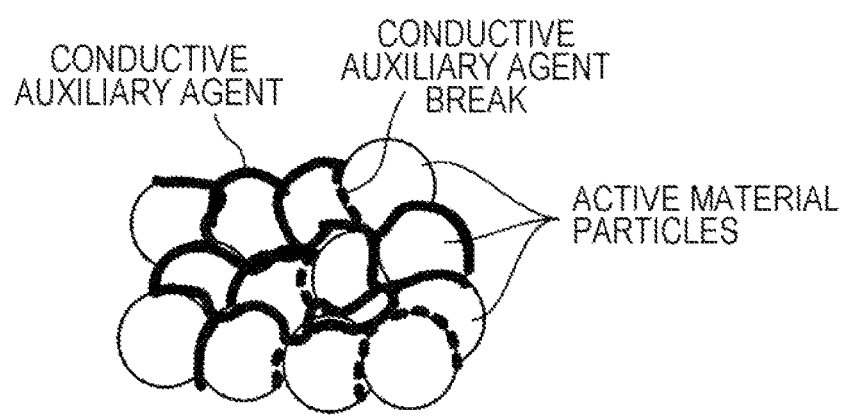
FIG. 5 is an explanatory diagram illustrating a break in a conductive path of a conductive auxiliary agent.

FIG. 5 is an explanatory diagram illustrating a break in a conductive path of a conductive auxiliary agent. The electrode material in the energy storage device 1 is often inferior in electron conductivity, so that conductivity is maintained by adding a small amount of conductive auxiliary agents such as acetylene black. However, the auxiliary agents may be broken due to expansion and contraction of particles (active material particles constituting the electrode) caused by charge and discharge. Alternatively, the conductive auxiliary agents may disappear due to a chemical reaction. As a result, a path through which a current flows decreases and electric resistance increases.

Figure 6:
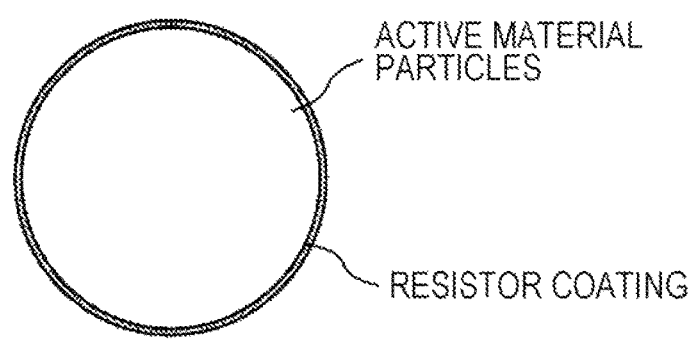
FIG. 6 is an explanatory diagram illustrating formation of a resistor coating.

FIG. 6 is an explanatory diagram illustrating formation of the resistor coating. A film of a resistor is formed on surfaces of the active material particles during charge and discharge. For example, a lithium ion battery causes a film formed of a compound composed of an organic substance and lithium ions in an electrolyte solution to be formed. Such a coating is inferior in conductivity and thus electric resistance increases.

A rate at which electric resistance increases, i.e., a rate at which electrical conductivity decreases, is calculated by Expressions 11 and 12 below, for example.

$$r_{cycle,res} = -k_{0,res}(N)\exp\left(-\frac{E_{a0,res}}{RT}\right)|i|^{\alpha_{res}} \quad \text{[Expression 11]}$$

Here, $r_{cycle,\ res}$ represents a rate (S/m/the number of cycles) at which the electrical conductivity decreases in accordance with the number of cycles. Typically, $r_{cycle,\ res}$ is less than zero. A reaction rate constant is designated as $k_{0,res}$ that is a function of the number of cycles, for example. Activation energy (J/mol) of cycle deterioration is designated as $E_{a0,\ res}$ that is a coefficient representing an effect of temperature. Current density (A/m²) is designated as i, and an absolute value is shown with "| |". A magnitude of the current density i is a coefficient related to an expansion-contraction rate of an electrode and representing a rupture phenomenon dependent on a strain rate, such as creep or crack growth. A constant is designated as $\alpha_{res}$. Values of $k_{0,\ res}$, $E_{a1,\ res}$, and $\alpha_{res}$ may be set by a user or may be preset in the estimation device 10. Decrease in temperature often increases a rate of decrease in electrical conductivity, so that $E_{a1,\ res}$ is preferably set to less than 0.0. When the decrease in electrical conductivity is not required to be considered, an appropriate parameter may be invalidated, such as by setting $k_{0,\ res}$ to 0.0.

$$r_{t,res} = -k_{1,res}(t)\exp\left(-\frac{E_{a1,res}}{RT}\right)\Delta t \quad \text{[Expression 12]}$$

Here, $r_{t,\ res}$ represents a rate (S/m/s) at which the electrical conductivity decreases in accordance with elapsed time. Typically, $r_{t,\ res}$ is less than zero. A reaction rate constant is designated as $k_{1,res}$ that is a function of time, for example. Alternatively, $k_{1,\ res}$ may be defined by any function based on experimental data. Activation energy (J/mol) of time deterioration is designated as $E_{a1,\ res}$ that is a coefficient representing an effect of temperature. Elapsed time (s) is designated as $\Delta t$. Values of $k_{1,\ res}$ and $E_{a1,\ res}$ may be set by a user or may be preset in the estimation device 10.

When electrical conductivity at an N cycle is designated as $\sigma_s(N)$, $\sigma_s(N+1)$ is represented by Expression 11 obtained by adding a cycle deterioration rate and a time deterioration rate per one cycle to $\sigma_s(N)$. In consideration of $r_{cycle,\ res}$ that is less than zero and $r_{t,\ res}$ that is less than zero, as (N+1) is typically less than $\sigma_s(N)$. Thus, the electrical conductivity decreases with increase in the number of cycles and elapse of time.

$$\sigma_s(N+1) = \sigma_s(N) + r_{cycle,res} + r_{t,res} \quad \text{[Expression 13]}$$

The arithmetic expressions shown in Expressions 12 and 13 are merely examples, and may be freely modified based on experimental results, literature data, and the like. For example, the rate at which electrical conductivity decreases may be calculated using Expression 14 as a function of upper and lower limits of the SOC. Here, the upper and lower limits of the SOC represent upper and lower limits in a usage range of the energy storage device 1.

$$r_{cycle,res} = \\ -k_{0,res}(N)\exp\left(-\frac{E_{a0,res}}{RT}\right)|i|^{\alpha_{res}}f(SOC_{max}, SOC_{min}) \quad \text{[Expression 14]}$$

It is said that progress of deterioration such as increase in electric resistance is caused by stress due to expansion and contraction caused by charge and discharge. It is known that a magnitude of expansion and contraction is related to a range of use of the SOC, and that the expansion and the contraction increase by use up to the lower limit of the SOC. Thus, a deterioration rate may be applied as a function of the upper and lower limits of the SOC. When no electricity is supplied, no expansion and contraction is caused, and thus considering only cycle deterioration is often sufficient. Thus, a rate at which the electrical conductivity decreases may be calculated by Expression 12 in which a function having the upper limit value $SOC_{max}$ and the lower limit value $SOC_{min}$ of SOC as arguments is multiplied as a factor. The upper limit $SOC_{max}$ and the lower limit $SOC_{min}$ are derived from the SOC at each time calculated by a current integration method. There are many known cases in which as a value of $(SOC_{max} - SOC_{min})$ increases, a rate of increase in electric resistance increases. Thus, a function that increases a reaction rate as the value of $(SOC_{max} - SOC_{min})$ increases is preferably used.

Although the parameters of $k_{0,\ res}$, $E_{a0,\ res}$, $\alpha_{res}$, $k_{1,\ res}$, $E_{a1,\ res}$, $SOC_{max}$, and $SOC_{min}$ are used in the above-mentioned Expressions 11 to 14 for calculating the rate at which the electrical conductivity decreases, these parameters each preferably use values different between positive and negative electrodes for peeling between the current collector foil and the electrode, breakage of a conduction path of conductive auxiliary agents, and formation of a resistor coating. These values may be different between a charge process and a discharge process. Alternatively, some or all of these values may be identical, as needed. Alternatively, $k_{0, res}$ may be set to a value of 0.0 and invalidated as appropriate.

As the fourth deterioration mechanism, decrease in conductivity in an electrolyte solution will be described. The deterioration mechanism due to the decrease in conductivity in the electrolyte solution is a phenomenon in which a battery decreases in capacity due to increase in resistivity of the electrolyte solution and increase in internal resistance of the battery, caused by decrease in conductivity due to disappearance of charge carriers, decrease in conductivity due to generation of minute bubbles in an electrode, change in molecular structure in solvation, clogging of a separator, or the like. The disappearance of charge carriers occurs mainly when a resistor coating is formed on surfaces of the active material particles.

Figure 7:
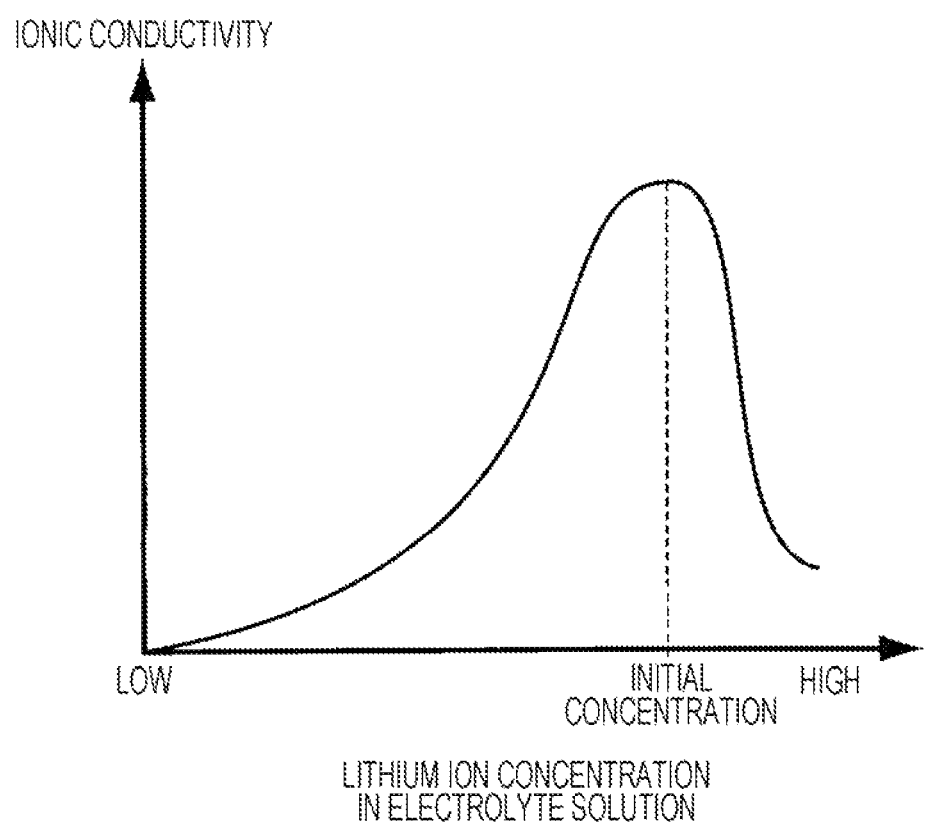
FIG. 7 is a graph showing a relationship between a concentration of lithium ions in an electrolyte solution and ionic conductivity.

Repeating charge and discharge is known to cause decrease of lithium ions in the electrolyte solution. The electrolyte solution has ionic conductivity that is a function of a concentration of lithium ions, and that is known to be generally maximum at the time of initial manufacture, and to decrease as the concentration of lithium ions decreases. FIG. 7 is a graph showing a relationship between a concentration of lithium ions in an electrolyte solution and ionic conductivity. FIG. 7 shows the graph in which the horizontal axis represents the concentration of lithium ions in the electrolyte solution, and the vertical axis represents the ionic conductivity. The relationship between the concentration of lithium ions in the electrolyte solution and the ionic conductivity is often as shown in FIG. 7. A rate of decrease in conductivity is calculated, for example, using a function similar to Expressions 11 and 12. Alternatively, the rate of decrease in conductivity may be calculated using an expression similar to Expression 14 in which a function of the upper and lower limits of the SOC serves as a factor. Alternatively, not only the ionic conductivity but also a diffusion coefficient may be changed.

The reason for the decrease in the concentration of lithium ions of the electrolyte solution is considered in which electrolyte salt is precipitated as an insoluble matter due to a product in trace amounts of oxidation reaction at a positive electrode of the electrolyte solution. As a result, a reaction that traps more lithium ions than the number of electrons consumed in reductive decomposition of the electrolyte solution at a negative electrode has occurred. As this reaction progresses, the concentration of lithium ions in the electrolyte solution gradually decreases to result in decrease in ionic conductivity.

Figure 8:
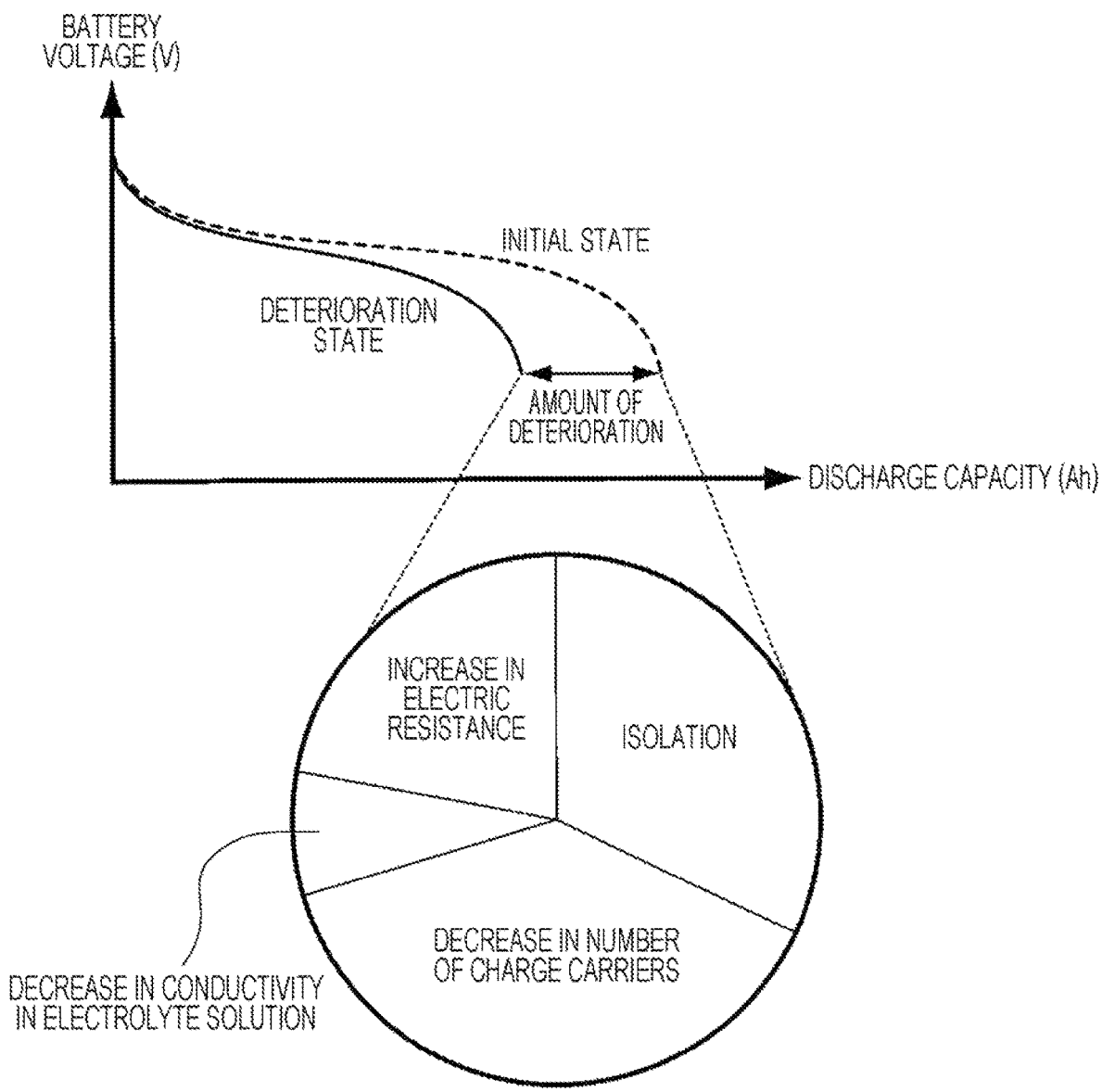
FIG. 8 is an explanatory diagram illustrating a breakdown of capacity decrease of an energy storage device.

FIG. 8 is an explanatory diagram illustrating a breakdown of capacity decrease of the energy storage device 1. FIG. 8 includes a graph in its upper part showing discharge characteristics of the energy storage device 1, where the horizontal axis represents discharge capacity (Ah) and the vertical axis represents battery voltage (V). As shown in FIG. 8, when capacity of the energy storage device 1 transitions from an initial state shown by a broken line to a deteriorated state shown by a solid line, decrease in the capacity is expressed as a sum of decrease in capacity ($\Delta Q_{iso}$) due to isolation, decrease in capacity ($\Delta Q_{imb}$) due to decrease in number of charge carriers, and decrease in capacity ($\Delta Q_{res}$) due to others. The decrease in capacity $\Delta Q_{res}$ due to others includes decrease in capacity due to the third deterioration mechanism (increase in electric resistance) and decrease in capacity due to the fourth deterioration mechanism (decrease in conductivity of the electrolyte solution).

To calculate the decrease in capacity $\Delta Q_{res}$, the control unit 11 may calculate the decrease in capacity $\Delta Q_{iso}$ due to the first deterioration mechanism according to Expression 7, and the decrease in capacity $\Delta Q_{imb}$ due to the second deterioration mechanism according to Expression 10, and then may subtract $\Delta Q_{iso}$ and $\Delta Q_{imb}$ from the total decrease in capacity to acquire remaining capacity as the decrease in capacity $\Delta Q_{res}$.

To calculate a breakdown of the remaining decrease in capacity $\Delta Q_{res}$, the control unit 11 may change values of conductivity and exchange current density used in a deterioration mechanism other than that of interest to very large values (e.g., 1000 times an initial value) to eliminate influence of the deterioration mechanism other than that of interest, and then may calculate the decrease in capacity due to the deterioration mechanism of interest. For example, decrease in capacity due to the third deterioration mechanism may be calculated with the solid phase volume ratio in the first deterioration mechanism, being set to a value at the time of manufacture, the amount of charge carrier in the second deterioration mechanism, being set to a value at the time of manufacture, and conductivity and a diffusion coefficient of the electrolyte solution in the fourth deterioration mechanism, being set to a value at the time of manufacture. Similarly, decrease in capacity due to the fourth deterioration mechanism may be calculated with the solid phase volume ratio in the first deterioration mechanism, being set to a value at the time of manufacture, the amount of charge carrier in the second deterioration mechanism, being set to a value at the time of manufacture, and the amount of increase in electric resistance in the third deterioration mechanism, being set to zero.

The estimation device 10 according to the first embodiment identifies a deterioration factor by estimating the amount of deterioration for each deterioration mechanism, and proposes a reuse method of the energy storage device 1, being suitable for the identified deterioration factor.

For example, when the energy storage device 1 is used in an automobile in a cold region, a SOC has often a large fluctuation range due to a large discharge current and a low temperature. This causes peeling between the current collector foil and the electrode, and a break between conductive auxiliary agents, so that electric resistance is likely to increase. In contrast, isolation and decrease in number of charge carriers are less likely to occur. That is, the energy storage device 1 as described above is likely to deteriorate mainly due to increase in electric resistance. The estimation device 10 according to the first embodiment can identify a deterioration factor by estimating the amount of deterioration for each deterioration mechanism. When a main deterioration factor is increase in electric resistance and isolation and decrease in number of charge carriers have not progressed, it is estimated that the amount of electricity that can be stored has not decreased since the time of manufacture. When this energy storage device 1 is reused, there is no problem in using it with a small current, and thus it may be used for storing a current generated by a generator with relatively small fluctuations such as solar power generation, wind power generation, and geothermal power generation. From this, when the main deterioration factor is increase in electric resistance, the control unit 11 of the estimation device 10 outputs information on recommendation that energy storage of natural energy is applied as a reuse application.

When the energy storage device 1 is used in an automobile in a tropical region, a SOC has often a large fluctuation range due to a large discharge current and a high temperature, and thus isolation is likely to progress remarkably. The energy storage device 1 in which the isolation has progressed is not suitable for long-term applications or high-current applications due to decrease in the amount of electricity that can be stored. From this, when the main deterioration factor is isolation, the control unit 11 of the estimation device 10 outputs information on recommendation that a short-time auxiliary power supply such as an uninterruptible power supply (UPS), or a power supply for disaster prevention storage batteries, is applied as a reuse application.

When the energy storage device 1 is used as an auxiliary power supply or power supply system of a building, a SOC has often a small fluctuation range due to a small discharge current and a small change in temperature, and thus electric resistance is less likely to increase and isolation is less likely to progress. In contrast, it is often used for a long period of time, so that a film on a surface of a negative electrode grows, and decrease in number of charge carriers (capacity imbalance) progresses, in many cases. In this case, the energy storage device 1 decreases in open circuit potential. From this, when the main deterioration factor is decrease in number of charge carriers, the control unit 11 of the estimation device 10 outputs information on recommendation that a short-time auxiliary power supply such as an uninterruptible power supply (UPS), or a power supply for disaster prevention storage batteries, is applied as a reuse application. When reuse as an auxiliary power supply or a power supply for disaster prevention storage batteries is difficult, the control unit 11 may propose recycling after dismantling and cleaning. Recycling means reusing after collecting and disassembling a battery, and is different from reuse without disassembling a battery cell. When the deterioration factor is decrease in number of charge carriers, peeling off a film on surfaces of the active material particles of the negative electrode allows an electrode material to be as good as new, and thus allowing recycling to be relatively easy. In contrast, recycling of an electrode material in which isolation or increase in electric resistance progresses is not easy due to a requirement for starting over from granulation.

Hereinafter, processing executed by the estimation device 10 will be described.

Figure 9:
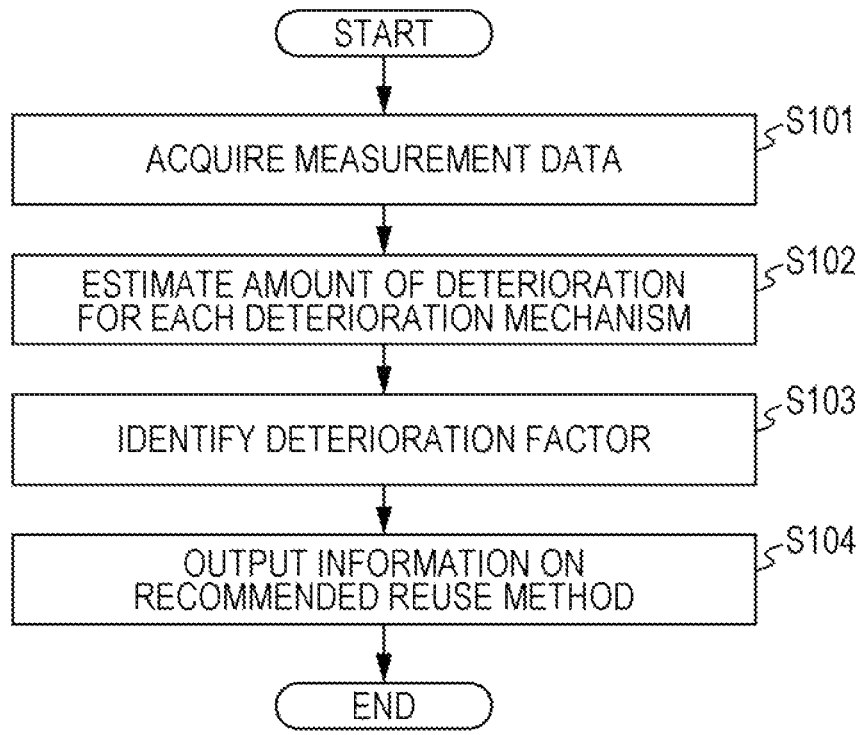
FIG. 9 is a flowchart illustrating a procedure of processing executed by the estimation device according to the first embodiment.

FIG. 9 is a flowchart illustrating a procedure of processing executed by the estimation device 10 according to the first embodiment. The control unit 11 of the estimation device 10 acquires measurement data on a discharge current and temperature of the energy storage device 1 through the input unit 13 (step S101). The discharge current of the energy storage device 1 is a measurement value measured in time series by the current sensor 131, and the temperature of the energy storage device 1 is a measurement value measured in time series by the temperature sensor 132.

Next, the control unit 11 estimates the amount of deterioration for each deterioration mechanism based on the acquired measurement data (step S102). The control unit 11 may estimate the amount of deterioration at that time each time the measurement data is acquired from the input unit 13, or may estimate the amount of deterioration at each point in time by reading out the measurement data sequentially from the storage unit 12 after allowing the storage unit 12 to store the measurement data for a predetermined period.

The control unit 11 calculates the decrease in capacity $\Delta Q_{iso}$ due to isolation (first deterioration mechanism) according to Expression 7, and calculates the decrease in capacity $\Delta Q_{imb}$ due to decrease in number of charge carriers (second deterioration mechanism) according to Expression 10. The battery capacity $Q_0$ at the time of manufacture may be given in advance as an initial value, or may be calculated by the control unit 11 according to Expression 4 at the time of first operation. The control unit 11 may further calculate the amount of deterioration (decrease in capacity) due to at least one of increase in electric resistance (third deterioration mechanism) in each element constituting the energy storage device 1 and decrease in conductivity in the electrolyte solution (fourth deterioration mechanism). The amount of deterioration due to the third and fourth deterioration mechanisms is calculated by subtracting $\Delta Q_{iso}$ and $\Delta Q_{imb}$ from the total decrease in capacity. To individually calculate the amount of deterioration due to the third and fourth deterioration mechanisms, the amount of deterioration due to the third or fourth deterioration mechanism may be calculated by changing parameters such as conductivity and exchange current density to eliminate influence of other deterioration mechanisms.

Next, the control unit 11 identifies a main deterioration factor of the energy storage device 1 (step S103). The control unit 11 refers to the amount of deterioration for each deterioration mechanism calculated in step S102, and determines the main deterioration mechanism. The main deterioration mechanism does not necessarily have the largest amount of deterioration.

Next, the control unit 11 generates information on a recommended reuse method for the energy storage device 1, being suitable for the identified main deterioration factor, and outputs the generated information on the reuse method from the output unit 14 (step S104). For example, when the main deterioration factor is increase in electric resistance, the control unit 11 outputs information on recommendation that energy storage of natural energy is applied as a reuse application. When the main deterioration factor is isolation, the control unit 11 outputs information on recommendation that an auxiliary power supply or a power supply for disaster prevention storage batteries is applied as a reuse application. When the main deterioration factor is decrease in number of charge carriers, the control unit 11 may output information on recommendation that an auxiliary power supply or a power supply for disaster prevention storage batteries is applied as a reuse application. When reuse is difficult, the control unit 11 may propose recycling after dismantling and cleaning. The information output from the output unit 14 is displayed, for example, on the display device 140. Alternatively, the control unit 11 may notify a terminal device used by a user, a battery management company, or the like of the information on the reuse method.

As described above, the estimation device 10 according to the first embodiment estimates the amount of deterioration for each deterioration mechanism, and identifies a deterioration factor suitable for the amount of deterioration estimated for each deterioration mechanism. The estimation device 10 can propose a reuse method of the energy storage device 1, being suitable for a deterioration factor, to the user, the battery management company, or the like.

The first embodiment is configured to propose a reuse method of the energy storage device 1, being suitable for a deterioration factor, to a user, a battery management company, or the like. Alternatively, a battery model or a design proposal suitable for a user's usage environment may be proposed. For example, when it is estimated that deterioration due to electrolyte solution shortage is likely to progress in the user's usage environment, the estimation device 10 may propose a model specialized for measures against deterioration due to electrolyte solution shortage to the user, or may propose development of a model with measures against deterioration due to electrolyte solution shortage to a battery management company.

Second Embodiment

A second embodiment describes a configuration in which recommended operating conditions are determined based on the amount of deterioration of the energy storage device 1 estimated from measurement data and the amount of deterioration of the energy storage device 1 estimated by virtually changing operating conditions, and information on the operating conditions determined is output.

Figure 10:
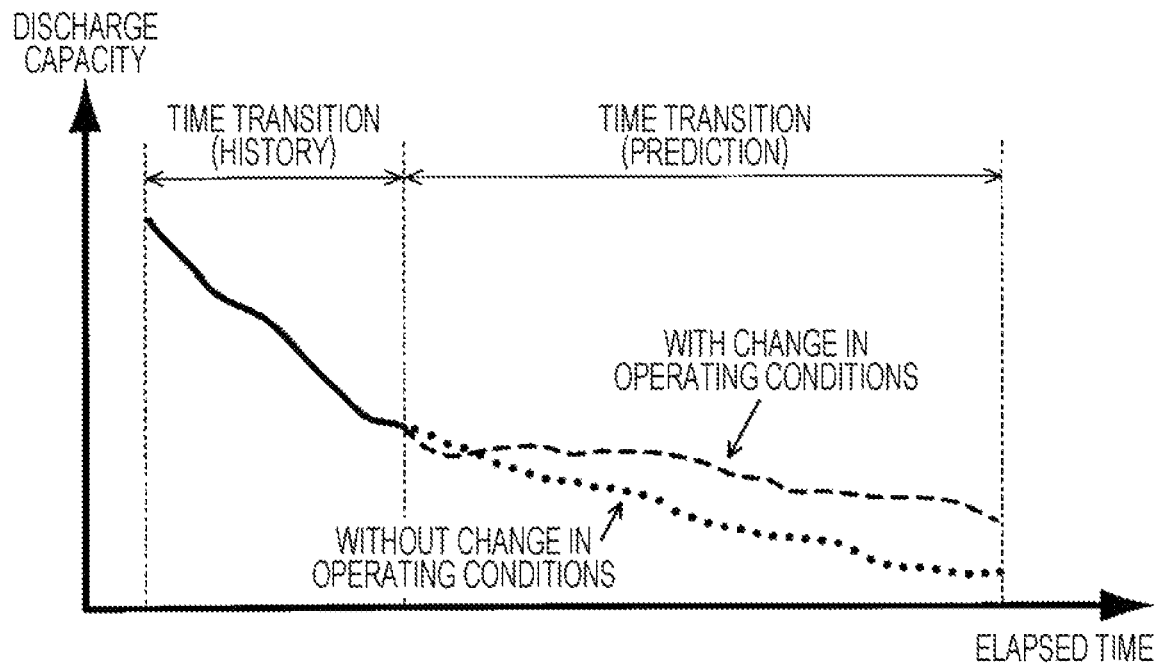
FIG. 10 is a graph showing time transition of discharge capacity.

FIG. 10 is a graph showing time transition of discharge capacity. The graph has the horizontal axis that represents elapsed time after start of operation, and the vertical axis that represents discharge capacity of the energy storage device 1. The graph shows the solid line that is time transition of the discharge capacity estimated from measurement data, and the dotted line connected to the solid line that is time transition of predicted values of the discharge capacity. The graph also shows the broken line that is time transition of the discharge capacity estimated by virtually changing operating conditions.

The time transition of the discharge capacity estimated from the measurement data is derived by the control unit 11 of the estimation device 10. The control unit 11 acquires measurement data on a discharge current and temperature measured in time series by the current sensor 131 and the temperature sensor 132, and estimates the amount of deterioration of the energy storage device 1 at each point in time in the past by using the deterioration simulation described in the first embodiment. The control unit 11 derives the time transition (history) of the discharge capacity by subtracting the amount of deterioration estimated at each point in time from the discharge capacity in the initial state. The control unit 11 can predict time transition of the discharge capacity in the future from the derived time transition (history) of the discharge capacity. For example, the control unit 11 may predict the discharge capacity at each point in time in the future by using the history of the discharge capacity up to the present time on the assumption that similar usage will be continued in the future. Alternatively, the control unit 11 may predict the time transition of the discharge capacity in the future by estimating a discharge current and temperature at a point in time in the future and acquiring the amount of deterioration based on the estimated discharge current and temperature.

The time transition of the discharge capacity when the operating conditions are virtually changed is estimated by the control unit 11 of the estimation device 10. The control unit 11 appropriately sets values of a discharge current, temperature, a SOC, and the like at each point in time used in a simulation in accordance with the changed operating conditions, and estimates the amount of deterioration of the energy storage device 1 at each point in time by using the deterioration simulator described in the first embodiment. The control unit 11 derives the time transition (predicted values) of the discharge capacity when the operating conditions are virtually changed by subtracting the estimated amount of deterioration at each point in time from the discharge capacity in the initial state.

The control unit 11 determines recommended operating conditions of the energy storage device 1 based on the time transition of the discharge capacity estimated from the measurement data and the time transition of the discharge capacity estimated by virtually changing the operating conditions, and outputs information on the determined operating conditions. For example, when the simulation is executed under operating conditions where temperature is reduced by 5° C. and an estimation result is acquired in which life is extended by one year, the control unit 11 outputs information that the life will be extended by one year when operating temperature of the energy storage device 1 is reduced by 5° C. Similarly, when the simulation is executed under operating conditions where an SOC usage range is changed from a current range (e.g., 0 to 100%) to a narrowed range (e.g., 10 to 100%) and an estimation result is acquired in which life is extended by one year, the control unit 11 may output information that the life is extended by one year by charge when remaining battery charge (SOC) decreases to 10%. Alternatively, the control unit 11 may be configured to convert the life of the energy storage device 1 into drive time of an apparatus equipped with the energy storage device 1, mileage of a vehicle, or the like, and output information such as the drive time and the mileage acquired by the conversion.

Figure 11:
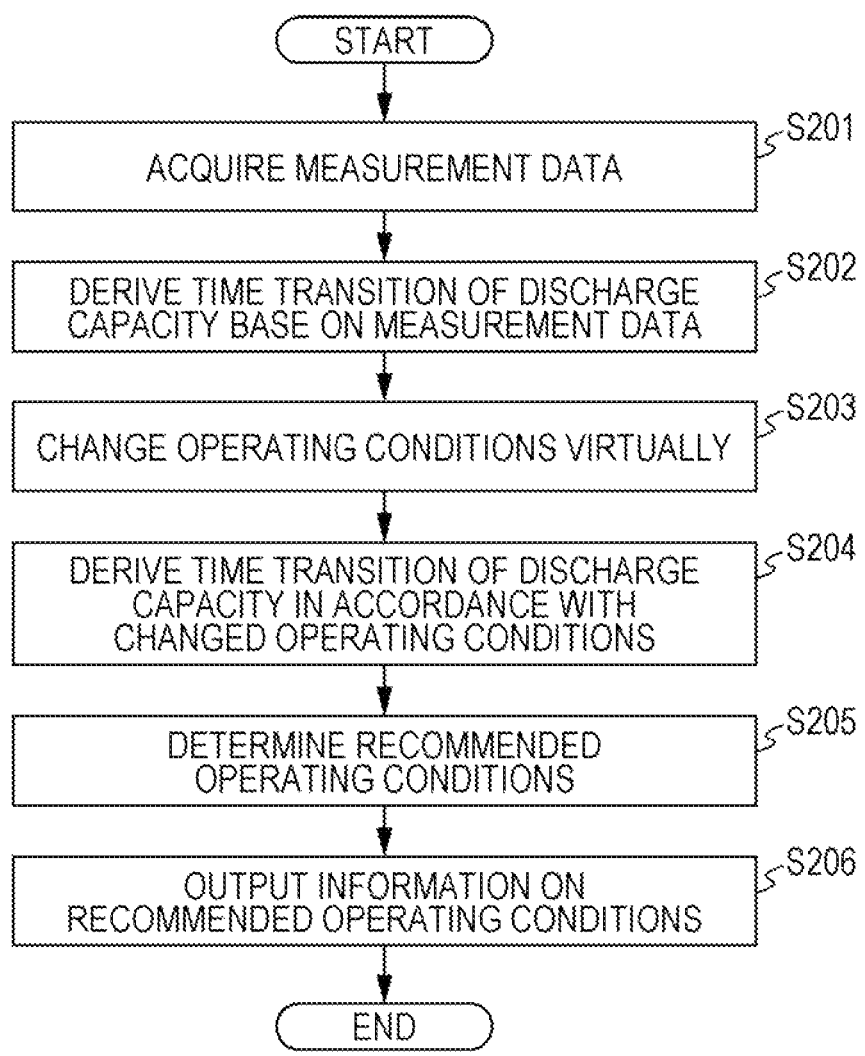
FIG. 11 is a flowchart illustrating a procedure of processing executed by an estimation device according to a second embodiment.

FIG. 11 is a flowchart illustrating a procedure of processing executed by the estimation device 10 according to the second embodiment. The control unit 11 of the estimation device 10 acquires measurement data on a discharge current and temperature of the energy storage device 1 through the input unit 13 (step S201). The discharge current of the energy storage device 1 is a measurement value measured in time series by the current sensor 131, and the temperature of the energy storage device 1 is a measurement value measured in time series by the temperature sensor 132.

Next, the control unit 11 derives time transition of discharge capacity based on the measurement data (step S202). At this time, the control unit 11 estimates the amount of deterioration of the energy storage device 1 based on the measurement data acquired in step S201. The deterioration simulator described in the first embodiment is used for estimating the amount of deterioration. The control unit 11 may estimate the amount of deterioration at that time each time the measurement data is acquired from the input unit 13, or may estimate the amount of deterioration at each point in time by reading out the measurement data sequentially from the storage unit 12 after allowing the storage unit 12 to store the measurement data for a predetermined period. The control unit 11 derives the time transition (history) of the discharge capacity by subtracting the amount of deterioration at each point in time from the discharge capacity in the initial state. The control unit 11 may predict time transition of the discharge capacity in the future from the derived time transition (history) of the discharge capacity.

Next, the control unit 11 virtually changes the operating conditions (step S203), and derives the time transition of the discharge capacity in accordance with the changed operating conditions (step S204). At this time, the control unit 11 appropriately sets values of a discharge current, temperature, a SOC, and the like at each point in time used in a simulation in accordance with the changed operating conditions, and estimates the amount of deterioration of the energy storage device 1 by using a deterioration simulator. The control unit 11 derives the time transition (predicted value) of the discharge capacity when the operating conditions are changed by subtracting the amount of deterioration at each point in time from the discharge capacity in the initial state.

Next, the control unit 11 determines recommended operating conditions (step S205). The control unit 11 may execute the processing of steps S203 and S204 multiple times by changing various conditions such as a discharge current, temperature, and a SOC to determine the recommended operating conditions. When it is found that life of the energy storage device 1 is extended, for example, by changing operating conditions, the control unit 11 may determine the changed operating conditions as the recommended operating conditions.

Next, the control unit 11 outputs information on the recommended operating conditions from the output unit 14 (step S206). The control unit 11 may be configured to output the information to the display device 140 connected to the output unit 14 and to cause the display device 140 to display the information on the recommended operating conditions. Alternatively, the control unit 11 may notify a terminal device used by a user, a battery management company, or the like of the information on the recommended operating conditions.

As described above, the estimation device 10 according to the second embodiment determines the recommended operating conditions based on the time transition of the discharge capacity derived from the measurement data and the time transition of the discharge capacity derived by virtually changing the operating conditions. The estimation device 10 can propose the recommended operating conditions for the energy storage device 1 to the user, the battery management company, or the like.

Third Embodiment

A third embodiment describes a configuration in which a remaining value of the energy storage device 1 is calculated and information on replacement time is output based on the calculated remaining value.

Figure 12:
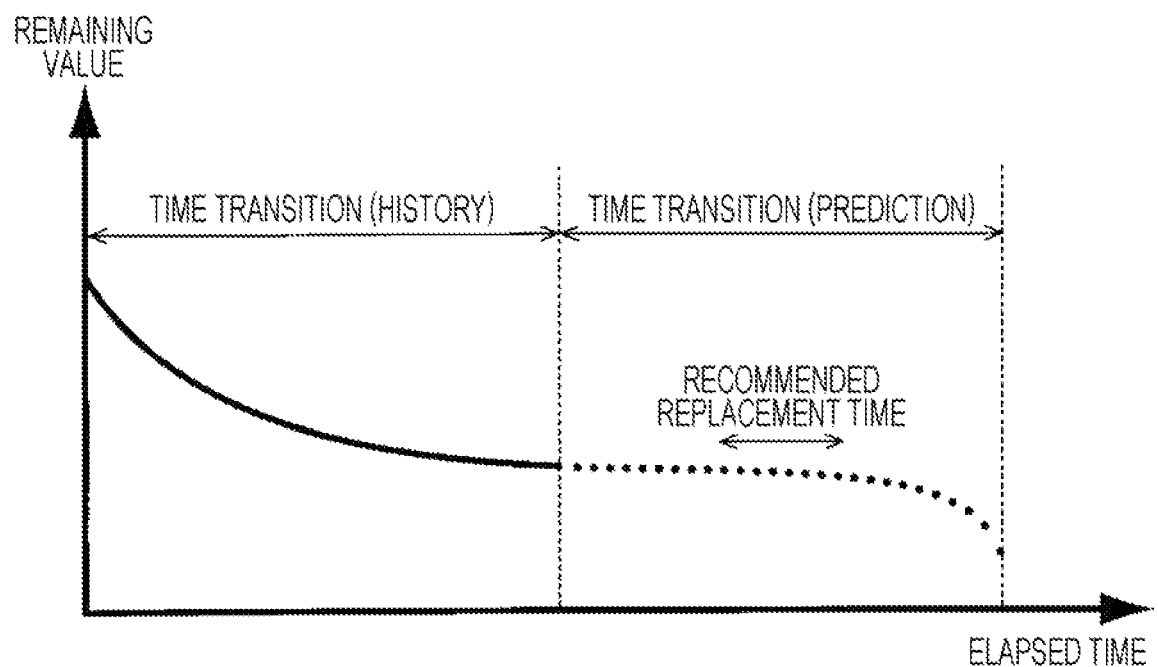
FIG. 12 is a graph showing time transition of a remaining value.

FIG. 12 is a graph showing time transition of a remaining value. The graph has the horizontal axis that represents elapsed time after start of operation, and the vertical axis that represents a remaining value of the energy storage device 1. The control unit 11 of the estimation device 10 calculates the remaining value of the energy storage device 1 based on the fact that decrease in capacity due to isolation of active material particles is roughly proportional to the remaining value of the energy storage device 1, for example. The isolation of the active material particles is estimated from the amount of deterioration of the energy storage device 1 due to the first deterioration mechanism (isolation of active material particles) as described in the first embodiment. The control unit 11 calculates remaining capacity by subtracting the estimated amount of deterioration from the discharge capacity in the initial state, and derives a remaining value by multiplying the calculated remaining capacity by a preset constant of proportionality.

The control unit 11 may predict time transition of the remaining value in the future. For example, the control unit 11 may predict the remaining value at each point in time in the future by using the history of the remaining value up to the present time on the assumption that similar usage will be continued in the future. The control unit 11 may determine a transaction price of a reuse product based on a predicted value of the remaining value at a point in time in the future. Alternatively, the control unit 11 may predict the time transition of the remaining value in the future by estimating a discharge current and temperature at a point in time in the future and acquiring the amount of deterioration due to isolation of active material particles based on the estimated discharge current and temperature.

The control unit 11 outputs information on replacement time of the energy storage device 1 based on the derived remaining value. The isolation of active material particles in the energy storage device 1 is known to progress rapidly at the end of a cycle. When the isolation progresses rapidly at the end of the cycle, the remaining value of the energy storage device 1 decreases sharply. Thus, the control unit 11 may notify a user or the like of a predetermined period before timing when the remaining value decreases sharply as the replacement time of the energy storage device 1.

There is a concern that batteries will be used beyond their expected lives. Batteries at the end of their lives may have high resistance, low capacity, and rapid deterioration with use. When this kind of battery is used as a battery system in combination with another battery, a used battery cannot exhibit expected performance, and performance of the entire battery system may also significantly deteriorate. This technique enables such concerns to be dispelled by proposing disposal time to a user, or by prohibiting or bypassing charge and discharge of a battery in a BMU.

Figure 13:
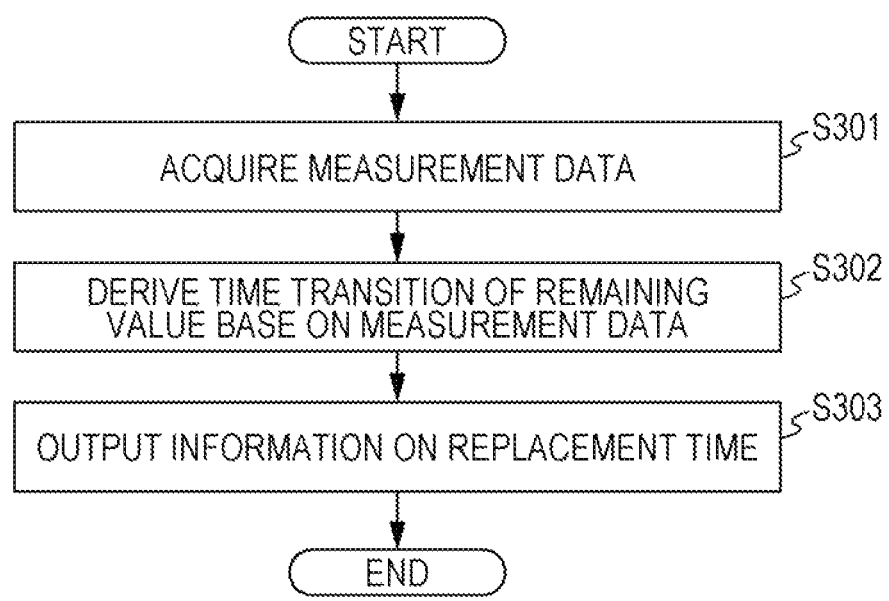
FIG. 13 is a flowchart illustrating a procedure of processing executed by an estimation device according to a third embodiment.

FIG. 13 is a flowchart illustrating a procedure of processing executed by the estimation device 10 according to the third embodiment. The control unit 11 of the estimation device 10 acquires measurement data on a discharge current and temperature of the energy storage device 1 through the input unit 13 (step S301). The discharge current of the energy storage device 1 is a measurement value measured in time series by the current sensor 131, and the temperature of the energy storage device 1 is a measurement value measured in time series by the temperature sensor 132.

Next, the control unit 11 derives time transition of the remaining value of the energy storage device 1 based on the measurement data (step S302). At this time, the control unit 11 estimates the amount of deterioration of the energy storage device 1 due to the first deterioration mechanism (isolation of active material particles) based on the measurement data acquired in step S301. The deterioration simulator described in the first embodiment is used for estimating the amount of deterioration. The control unit 11 may estimate the amount of deterioration at that time each time the measurement data is acquired from the input unit 13, or may estimate the amount of deterioration at each point in time by reading out the measurement data sequentially from the storage unit 12 after allowing the storage unit 12 to store the measurement data for a predetermined period. The control unit 11 acquires remaining capacity at each point in time from the estimated amount of deterioration at each point in time, and multiplies the remaining capacity by a preset proportionality constant to derive the time transition of the remaining value.

Next, the control unit 11 outputs information on replacement time of the energy storage device 1 based on the derived time transition of the remaining value (step S303). The control unit 11 may notify a predetermined period before timing when the remaining value decreases sharply as the replacement time of the energy storage device 1. The timing at which the remaining value decreases sharply is identified as, for example, timing at which a degree of decrease in the remaining value per unit time increases more than a threshold value. The replacement time may be set as a predetermined period (e.g., three months to one month before) before the timing at which the remaining value decreases sharply. The control unit 11 causes the display device 140 connected to the output unit 14 to display information on the recommended replacement time. Alternatively, the control unit 11 may notify a terminal device used by a user, a battery management company, or the like of the information on the recommended replacement time.

The battery management company may set a used purchase price based on progress of deterioration obtained as a simulation result, i.e., the remaining value, and present the purchase price to the user.

As described above, the estimation device 10 according to the third embodiment calculates the remaining value of the energy storage device 1 and outputs information on the replacement time based on the calculated remaining value. This enables encouraging the user in replacement at timing when the energy storage device 1 can be reused.

The third embodiment is exemplarily described in which the remaining value is determined by the isolation of the active material particles. Alternatively, the remaining value may be determined in consideration of effects of increase in electric resistance, decrease in number of charge carriers, decrease in conductivity in an electrolyte solution, and the like, and a performer of determination of the remaining value may freely determine a combination and a weight.

When the estimation device 10 is mounted on a circuit board provided in the energy storage device 1 (see FIG. 1), a remaining value can be determined for and various evaluations can be performed for the energy storage device 1 distributed with the estimation device 10 attached, being removed from a system, using a terminal device used by a user, a battery management company, or the like.

The disclosed embodiments are exemplary in all respects and are not restrictive. The scope of the present invention is indicated by the scope of claims and includes all modifications within the meaning and scope equivalent to the scope of claims.

What is claimed is:

1. An estimation device comprising:
   an acquisition unit that acquires measurement data on an energy storage device;
   an estimation unit that estimates amounts of deteriorations for respective deterioration mechanisms of the energy storage device based on the acquired measurement data, the deterioration mechanisms including isolation of active material particles and decrease in number of charge carriers involved in charge and discharge; and
   an output unit that outputs information based on an estimation result of the estimation unit.

2. The estimation device according to claim 1, wherein the deterioration mechanisms further includes at least one of increase in electric resistance in each element constituting the energy storage device and decrease in conductivity in an electrolyte solution.

3. The estimation device according to claim 1, wherein the output unit is configured to identify a deterioration factor of the energy storage device based on an estimation result of the estimation unit, and output information on a recommended reuse method of the energy storage device, being suitable for the identified deterioration factor.

4. The estimation device according to claim 3, wherein the output unit is configured to output information on use for storing natural energy as a recommended reuse method when the main deterioration factor is increase in electric resistance.

5. The estimation device according to claim 1, wherein the output unit is configured to determine recommended operating conditions of the energy storage device based on the amount of deterioration estimated based on the measurement data and the amounts of deteriorations estimated by virtually changing operating conditions of the energy storage device, and output information on the determined operating conditions.

6. The estimation device according to claim 1, wherein the output unit is configured to output a remaining value of the energy storage device based on an estimation result of the estimation unit.

7. The estimation device according to claim 6, wherein the output unit is configured to output information on replacement time of the energy storage device based on the calculated remaining value.

8. An energy storage device comprising:
   a circuit board equipped with the estimation device according to claim 1.

9. The estimation device according to claim 1, wherein the measurement data includes data on a current and temperature of the energy storage device, and
   the estimation unit estimates the amount of deterioration based on the isolation of the active material particles by
      calculating a rate at which the isolation of the active material particles progresses based on the data on the current and temperature of the energy storage device, and
      calculating a solid-phase volume ratio of the active material particles based on the calculated rate.

10. The estimation device according to claim 1, wherein the estimation unit calculates decrease in capacity due to decrease in number of charge carriers after eliminating effect of isolation of the active material particles by changing a solid-phase volume ratio of the active material particles at positive and negative electrodes of the energy storage device at calculation time to a solid-phase volume ratio at a time of manufacture.

11. The estimation device according to claim 1, wherein the output unit is configured to output information on use at a low rate as a recommended reuse method when deterioration of the energy storage device is mainly caused by the isolation of active material particles.

12. A method for estimation implemented by a computer, the method comprising the steps of:
   acquiring measurement data on an energy storage device;
   estimating amounts of deteriorations for respective deterioration mechanisms of the energy storage device based on the acquired measurement data, the deterioration mechanisms including isolation of active material particles and decrease in number of charge carriers involved in charge and discharge; and
   outputting information based on an estimation result.

13. A non-transitory computer readable medium containing computer program that allows a computer to execute the processes of:
   acquiring measurement data on an energy storage device;
   estimating amounts of deteriorations for respective deterioration mechanisms of the energy storage device based on the acquired measurement data, the deterioration mechanisms including isolation of active material particles and decrease in number of charge carriers involved in charge and discharge; and
   outputting information based on an estimation result.

* * * * *